(12) United States Patent
Sulva

(10) Patent No.: US 9,435,552 B2
(45) Date of Patent: Sep. 6, 2016

(54) AIR FILTRATION AND HANDLING FOR NUCLEAR REACTOR HABITABILITY AREA

(75) Inventor: Michael Sulva, Wilmington, NC (US)

(73) Assignee: GE-HITACHI NUCLEAR ENERGY AMERICAS LLC, Wilmington, NC (US)

( * ) Notice: Subject to any disclaimer, the term of this patent is extended or adjusted under 35 U.S.C. 154(b) by 2060 days.

(21) Appl. No.: 11/957,117

(22) Filed: Dec. 14, 2007

(65) Prior Publication Data

US 2011/0217917 A1    Sep. 8, 2011

(51) Int. Cl.
- *F24F 3/16* (2006.01)
- *F24F 5/00* (2006.01)
- *H05K 7/20* (2006.01)

(52) U.S. Cl.
CPC ............ *F24F 3/161* (2013.01); *F24F 5/0017* (2013.01); *F24F 3/1603* (2013.01); *H05K 7/20836* (2013.01); *Y02E 60/147* (2013.01); *Y02E 70/30* (2013.01)

(58) Field of Classification Search
CPC ................................ F24F 3/16; Y02E 60/147
USPC .......................................................... 454/187
See application file for complete search history.

(56) References Cited

U.S. PATENT DOCUMENTS

| | | | | |
|---|---|---|---|---|
| 2,586,797 A | * | 2/1952 | Dunlop et al. ................... | 169/48 |
| 3,261,659 A | | 7/1966 | Schwichtenberg | |
| 3,418,915 A | * | 12/1968 | Marble .......................... | 454/187 |
| 3,570,385 A | * | 3/1971 | Heisterkamp et al. ....... | 454/187 |
| 3,782,265 A | * | 1/1974 | Pielkenrood et al. ........ | 454/187 |
| 3,884,133 A | * | 5/1975 | Miller .......................... | 454/229 |
| 3,975,995 A | * | 8/1976 | Shuler .......................... | 454/296 |
| 4,058,253 A | * | 11/1977 | Munk et al. ................. | 236/46 R |
| 4,461,205 A | * | 7/1984 | Shuler .......................... | 454/294 |
| 4,699,640 A | * | 10/1987 | Suzuki et al. ............... | 55/385.2 |
| 4,775,397 A | * | 10/1988 | Porembski ..................... | 95/286 |
| 4,805,835 A | * | 2/1989 | Schaus ......................... | 236/49.3 |

(Continued)

FOREIGN PATENT DOCUMENTS

| | | |
|---|---|---|
| CN | 1177709 A | 4/1998 |
| DE | 1 9723 954 A1 | 3/1998 |

(Continued)

OTHER PUBLICATIONS

Liebert Corporation; Challenger 3000 Liebert Products Sales Literature. Liebert Products Apr. 2002 archive org.pdf.*

(Continued)

*Primary Examiner* — Steven B Mcallister
*Assistant Examiner* — Frances F Hamilton
(74) *Attorney, Agent, or Firm* — Harness, Dickey & Pierce, P.L.C.

(57) ABSTRACT

A system for circulating and conditioning air within a nuclear reactor habitability area is provided. The system may include an upper plenum formed between a lowered ceiling partition within the habitability area and a ceiling of the habitability area and a lower plenum formed between a raised floor partition within the habitability area and a floor of the habitability area. The system can additionally include at least one recirculation air handling unit located within the habitability area, the at least one recirculation air handling unit operable to generate a recirculation air flow within the habitability area by circulating air between the lower and upper plenums absent any air carrying ductwork routed through the ceiling, floor or walls of the habitability area.

15 Claims, 4 Drawing Sheets

(56) References Cited

U.S. PATENT DOCUMENTS

| | | | |
|---|---|---|---|
| 4,875,420 A * | 10/1989 | Hay et al. | 110/215 |
| 5,518,451 A * | 5/1996 | Renz et al. | 454/187 |
| 5,788,571 A * | 8/1998 | Ivison et al. | 454/252 |
| 6,053,809 A * | 4/2000 | Arceneaux | 454/228 |
| 6,209,330 B1 * | 4/2001 | Timmerman et al. | 62/179 |
| 6,368,208 B1 | 4/2002 | Minoshima | |
| 6,557,357 B2 * | 5/2003 | Spinazzola et al. | 62/89 |
| 6,572,468 B1 | 6/2003 | Sasaki et al. | |
| 6,869,457 B2 * | 3/2005 | Nakagawa | 55/385.2 |
| 7,083,515 B2 * | 8/2006 | Rapisarda et al. | 454/187 |
| 7,451,336 B2 * | 11/2008 | Manuell et al. | 713/324 |
| 7,510,470 B2 * | 3/2009 | Arts | 454/187 |
| 7,565,773 B1 * | 7/2009 | Romig | 52/79.1 |
| 8,721,409 B1 * | 5/2014 | Morales | H05K 7/20209 454/184 |
| 2001/0041530 A1 * | 11/2001 | Hara | 454/187 |
| 2005/0006488 A1 * | 1/2005 | Stanimirovic | F24F 11/0086 236/49.1 |
| 2005/0132677 A1 | 6/2005 | Bauer et al. | |
| 2006/0079172 A1 * | 4/2006 | Fleming et al. | 454/353 |
| 2006/0217055 A1 * | 9/2006 | Kupferberg et al. | 454/184 |
| 2007/0132262 A1 * | 6/2007 | Chui Peng Sun et al. | 296/24.38 |
| 2007/0167126 A1 * | 7/2007 | Ghattas | F24F 3/161 454/187 |
| 2008/0141703 A1 * | 6/2008 | Bean, Jr. | 62/434 |
| 2008/0185446 A1 * | 8/2008 | Tozer | 236/49.4 |
| 2008/0196786 A1 * | 8/2008 | Sigwarth et al. | 141/4 |
| 2008/0233860 A1 * | 9/2008 | Perry | F24F 7/06 454/238 |
| 2012/0295531 A1 * | 11/2012 | Duerig et al. | 454/187 |

FOREIGN PATENT DOCUMENTS

| | | |
|---|---|---|
| EP | 0 967 445 A2 | 12/1999 |
| EP | 1 544 553 A1 | 6/2005 |
| GB | 2 147 409 A | 5/1985 |
| GB | 2353569 A * | 2/2001 |
| JP | 58-190635 A | 11/1983 |
| JP | 07072281 A * | 3/1995 |
| JP | 10-096332 A | 4/1998 |
| JP | 2000-304322 A | 11/2000 |
| JP | 2001-93790 A | 10/2001 |
| JP | 2005-016785 A | 1/2005 |
| JP | 2005016785 A * | 1/2005 |

OTHER PUBLICATIONS

European Search Report dated Apr. 1, 2009.
Search Report issued in connection with CN Application No. 200810186308.1, Aug. 9, 2012.
Japanese Office Action issued in connection with corresponding JP Patent Application No. 2008-313823 dated on Sep. 17, 2013.

* cited by examiner

AIR FILTRATION AND HANDLING FOR NUCLEAR REACTOR HABITABILITY AREA

FIELD

The present teachings relate to systems and methods for providing filtered air to a habitability area of a nuclear reactor facility.

BACKGROUND

The statements in this section merely provide background information related to the present disclosure and may not constitute prior art.

Nuclear power plants require emergency systems for providing 'clean air' to plant control room habitability areas (CRHAs) in the case of a radiological and/or toxic event, i.e., the accidental release or leakage of radioactive and/or toxic contaminates, gas or smoke. Typically pressurized air storage systems are implemented to provide clean, safe air, i.e., air free of radioactive and toxic contaminates, for main control room emergency habitability in such situations. Such known pressurized air storage systems require the storage of large pressurized air tanks and the installation of associated piping, tubing, valves, regulator, instrumentation and operational controls. Additionally, systems and equipment must be installed to avoid over-pressurization during operation of such known pressurized air storage systems. Thus, known pressurized air storage systems can be design problematic, expensive to install, implement and operate, and problematic to maintain.

Furthermore, known control room habitability area HVAC subsystem designs typically utilize standard commercial draw through type air handling units (AHU) to circulate and condition air, i.e., heat and cool air, within the CRHA. More particularly, the layout of such designs typically requires one or more AHUs and return/exhaust fans to be installed externally to the CRHA. For example, often one or more AHUs and return/exhaust fans are located in a mechanical equipment room that is separated from the CRHA. The utilization of external AHUs and fans necessitates the installation of a large amount of insulated ductwork that must be routed from outside the CRHA to the interior of the CRHA. Such routing of ductwork from outside the CRHA can be problematic in meeting safety requirements regarding the 'in-leakage' of radioactive contaminated air from outside the CRHA during a radiological and/or toxic event.

SUMMARY

According to one aspect, a system for circulating and conditioning air within a nuclear reactor habitability area is provided. In various embodiments, the system may include an upper plenum formed between a lowered ceiling partition within the habitability area and a ceiling of the habitability area and a lower plenum formed between a raised floor partition within the habitability area and a floor of the habitability area. The system can additionally include at least one recirculation air handling unit located within the habitability area, the at least one recirculation air handling unit operable to generate a recirculation air flow within the habitability area by circulating air between the lower and upper plenums absent any air carrying ductwork routed through the ceiling, floor or walls of the habitability area.

In various other embodiments, the system may include an upper plenum formed between a ceiling partition within the habitability area and a ceiling of the habitability area, the ceiling partition including a plurality of air vents and a lower plenum formed between a raised floor partition within the habitability area and a floor of the habitability area, the floor partition including a plurality of air registers. The system may additionally include a pair of redundant recirculation air handling units located within the habitability area. Each recirculation air handling unit includes an air inlet fluidly connected to the upper plenum, an air outlet fluidly connected to the lower plenum and a fan operable to generate a forced air flow through the respective recirculation air handling unit by drawing air in from the upper plenum through the respective air inlet and forcing air out into the lower plenum through the respective air outlet. Accordingly, a recirculation air flow is created within the habitability area by air flowing out of the lower plenum through the floor partition registers and into the upper plenum through ceiling partition vents.

In yet other embodiments, the system may include an upper plenum formed between a ceiling partition within the habitability area and a ceiling of the habitability area, the ceiling partition including a plurality of air vents, and a lower plenum formed between a raised floor partition within the habitability area and a floor of the habitability area, the floor partition including a plurality of air registers. The system may additionally include a pair of redundant recirculation air handling units located within the habitability area. Each recirculation air handling unit includes an air inlet fluidly connected to the upper plenum, an air outlet fluidly connected to the lower plenum and a fan operable to generate a forced air flow through the respective recirculation air handling unit by drawing air in from the upper plenum through the respective air inlet and forcing air out into the lower plenum through the respective air outlet. Accordingly, a recirculation air flow is created within the habitability area by air flowing out of the lower plenum through the floor partition registers and into the upper plenum through ceiling partition vents. Furthermore, the system may include a chilled coolant thermal storage tank located in a room separate from the habitability area and fluidly connected to each of the recirculation air handling units. The chilled coolant thermal storage tank can provided chilled coolant to the recirculation air handling units for cooling the recirculation air flow generated by the respective recirculation air handling unit.

Further areas of applicability of the present teachings will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

DETAILED DESCRIPTION

Figure 1:
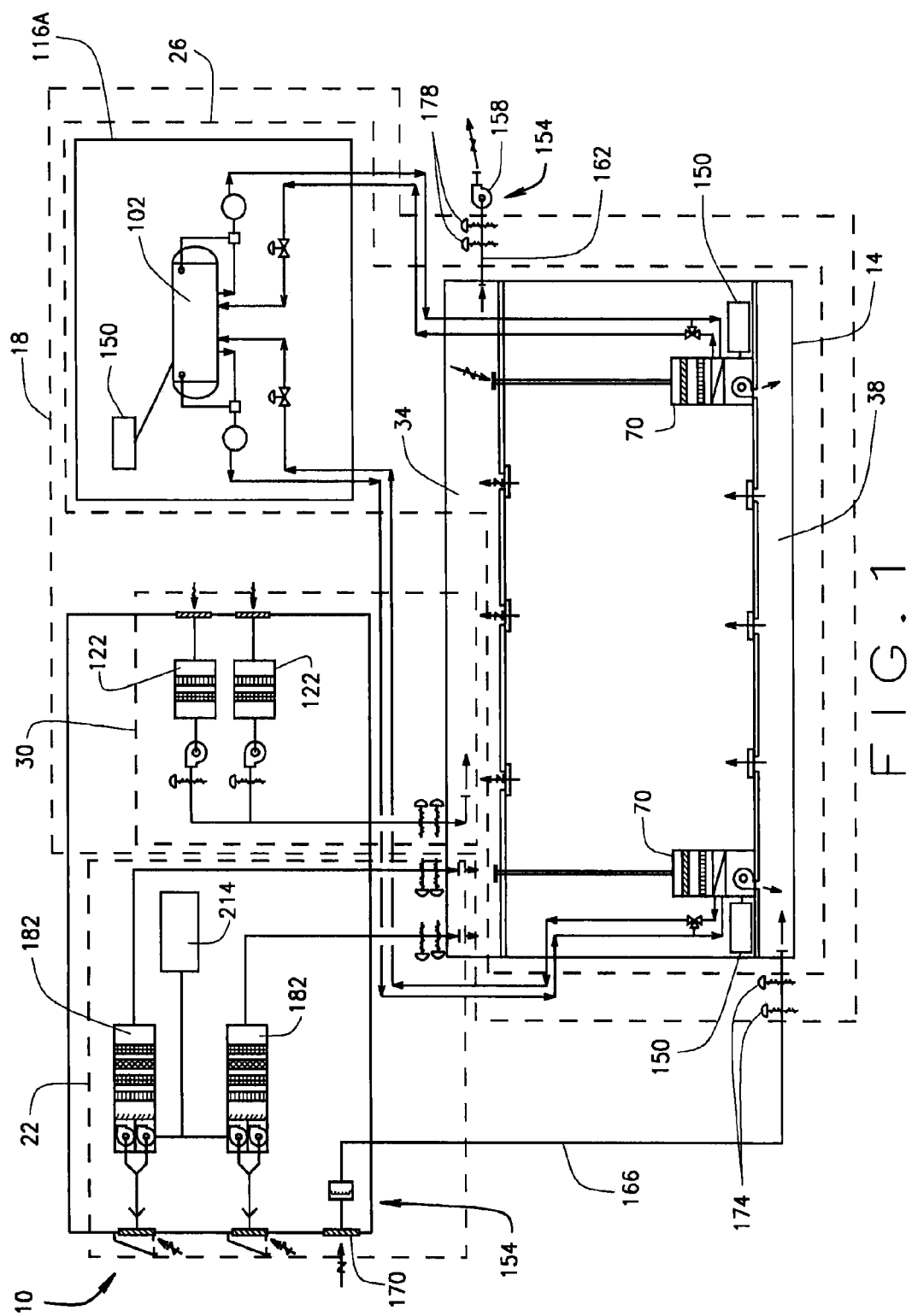
FIG. 1 is a block schematic of an air filtration and conditioning (AFC) system for a habitability area of a nuclear reactor facility, in accordance with various embodiments of the present disclosure.

The following description is merely exemplary in nature and is in no way intended to limit the present teachings, application, or uses. Throughout this specification, like reference numerals will be used to refer to like elements.

FIG. 1 is a block schematic of an air filtration and conditioning (AFC) system 10 for a habitability area 14 of a nuclear reactor facility, in accordance with various embodiments of the present disclosure. The habitability area 14 can be any area, room or building of nuclear reactor facility, such as a nuclear reactor power plant, that is constructed to be occupied by humans. For example, in various embodiments, the habitability area 14 can be a control room of a nuclear reactor power plant that is structured and equipped to be occupied by a plurality of plant personnel for controlling the operation of the plant. The AFC system 10 is structured and operable to generate an air flow within the habitability area 14 that provides safe, breathable air to the occupants of the habitability area 14. More particularly, as described below, during normal operation of the nuclear reactor facility, the AFC system 10 circulates air within the habitability area that is filtered to remove various non-radioactive, non-toxic environmental particulates such as dust, dirt, pollen, etc., and conditioned, i.e., heated and/or cooled, to a desired temperature. Additionally, as described below, during the occurrence of a nuclear and/or toxic event, the AFC system 10 seals off, or isolates, the habitability area from infiltration of air contaminated with radioactive and/or toxic matter and particulates and circulates air within the habitability area that is filtered to remove such radioactive and toxic matter and particulates.

Generally, the AFC system 10 includes a normal operations air filtering and conditioning (NOAFC) subsystem 18 and an emergency filtration (EF) subsystem 22. The NOAFC subsystem 18 is structured and operable during normal, day-to-day, operating conditions of the nuclear reactor facility, to condition and generate an air flow within the habitability area 14. More specifically, the NOAFC subsystem 18 is structured and operable to circulate air within the habitability area 14 that is filtered to remove various non-radioactive, non-toxic environmental particulates such as dust, dirt, pollen, etc., and conditioned, i.e., heated and/or cooled, to a desired temperature. The EF subsystem 22 is structured and operable to provide safe breathable air to the habitability area 14 during a radiological and/or toxic event. More specifically, the EF subsystem 22 is operable during a nuclear and/or toxic event to provide an air flow within the habitability area that is filtered to be substantially free from dangerous and hazardous radiological and/or toxic material, matter, particulates, gas, etc.

The NOAFC subsystem 18 includes a recirculation and conditioning subsystem 26 and a replacement air subsystem 30. The recirculation and conditioning subsystem 26 is structured and operable to generate and condition a recirculation air flow within the habitability area 14 absent any air carrying conduit, i.e., ductwork, that penetrates the outer boundary of the habitability area 14. The outer boundary of the habitability area 14, as used herein, is defined to be the composite structure of the walls, ceiling and floor that enclose the habitability area 14. Thus, there are no openings in the outer boundary for the ingress or egress of ductwork of the recirculation and conditioning subsystem 26 through which unsafe air, i.e., air contaminated with radioactive and/or toxic matter, can infiltrate the habitability area during a radiological and/or toxic event. As used herein, a radiological and/or toxic event is defined as an event in which dangerous and hazardous radiological and/or toxic material, matter, particulates, gas, etc., is released or leaked from a nuclear reactor of the nuclear reactor facility into the air.

The replacement air subsystem 30 is structured and operable to work in combination with the recirculation and conditioning subsystem 26 during normal, day-to-day, operating conditions of the nuclear reactor facility. Particularly, the replacement air subsystem is structured and operable to provide replacement air, filtered to remove various non-radioactive, non-toxic environmental particulates such as dust, dirt, pollen, etc., to the habitability area. Thus, during normal, day-to-day, operating conditions of the nuclear reactor facility, the recirculation and conditioning subsystem 26 and a replacement air subsystem 30 operate in combination to provide conditioned air, filtered to remove non-radioactive, non-toxic environmental particulates, to occupants of the habitability area 14.

Figure 2:
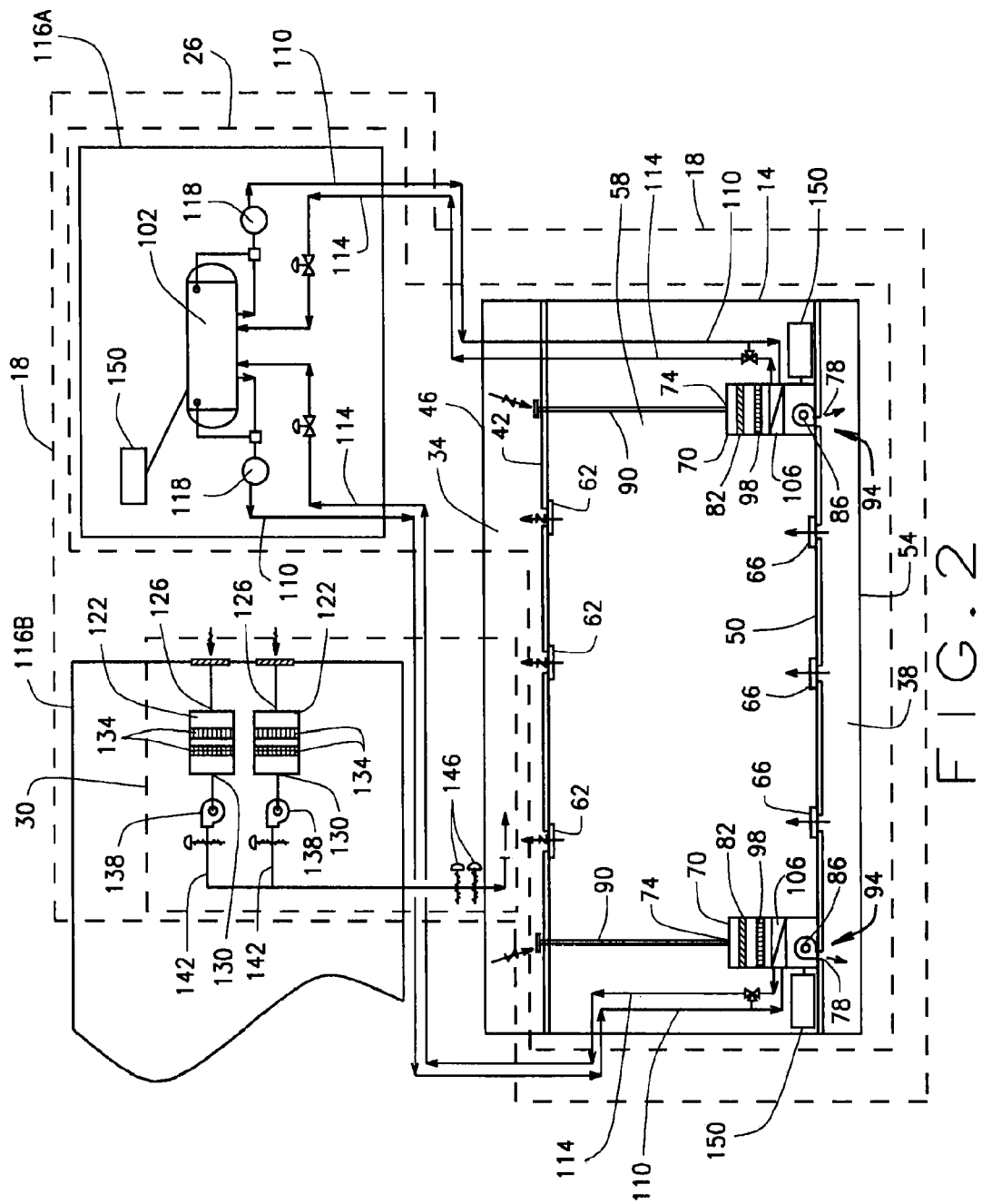
FIG. 2 is a block schematic of a normal operations air filtering and conditioning subsystem of the AFC system shown in FIG. 1, in accordance with various embodiments of the present disclosure.

Referring now to FIG. 2, the habitability area 14 is constructed to include an upper plenum 34 and a lower plenum 38. In various embodiments, the upper plenum 34 is formed between a ceiling partition 42 positioned, e.g., hung, within the habitability area 14 and a ceiling 46 of the habitability area 14. Similarly, in various embodiments, the lower plenum 38 is formed between a raised floor partition 50 positioned within the habitability area 14 and a floor 54 of the habitability area 14. The space within the habitability area 14 that is between the ceiling partition 42 and floor partition 50 will be referred to herein as the occupant space 58. The ceiling partition 42 includes a plurality of air vents 62 that allow air from within the occupant space 58 to flow into the upper plenum 34. Additionally, the floor partition 50 includes a plurality of air registers 66 that allow air from within the lower plenum 38 to flow into the occupant space 58.

As described above, the NOAFC subsystem 18 includes the recirculation and conditioning subsystem 26 and the replacement air subsystem 30. The recirculation and conditioning subsystem 26 and the replacement air subsystem 30 operate in combination to generate a conditioned and filtered air flow within the habitability area 14 during normal operation of the nuclear reactor facility.

The recirculation and conditioning subsystem 26 includes one or more recirculation air handling units 70 located within the habitability area 14. That is, the one or more recirculation air handling units 70 are physically located and installed within the confines of the outer boundary of the habitability area 14. In various implementations, the recirculation air handling unit(s) 70 is/are located with in the occupant space 58. In various embodiments, as illustrated in FIG. 2, the recirculation and conditioning subsystem 26 can include a pair of redundant recirculation air handling units 70. The redundant recirculation air handling units 70 are implemented such that if one recirculation air handling unit 70 fails or becomes inoperable, the second recirculation air handling unit 70 will be operable to generate the conditioned and filtered air flow within the habitability area 14, as described below. In various embodiments, each recirculation air handling unit 70 includes an air inlet 74, an air outlet 78, at least one filter 82 and a fan, or blower, 86. The fan 86 is operable to draw air into the respective recirculation air handling unit 70, via the inlet 74, pass the air through the filter(s) 82 and force the filtered air out through the outlet 78.

Each recirculation air handling unit 70 is fluidly connected to the upper plenum 34 via an inlet air stack, or duct, 90 that is connected at a first end to the respective recirculation air handling unit inlet 74. An opposing second end of each inlet air stack, or duct, 90 extends through the ceiling partition 42 and terminates within the upper plenum 34. Thus, air can flow from within the upper plenum 34, through each inlet air stack, or duct, 90 and into the respective recirculation air handling unit 70. Additionally, each recirculation air handling unit 70 is fluidly connected to the lower plenum 38 such that air can flow from within each recirculation air handling unit 70 into the lower plenum via the respective air outlet 78. In various embodiments, the air outlet 78 of each recirculation air handling unit 70 is located on a bottom of the respective recirculation air handling unit 70 such that each air outlet 78 is fluidly connected to the lower plenum 38 by locating each air outlet 78 over a respective outlet port, or opening, 94 in floor partition 50. However, in various other embodiments, each air outlet 78 may be fluidly connected to the lower plenum 38 via any suitable air conduit means such as suitable air duct work, hoses or piping connected between the respective air outlet 78 and a respective outlet port 94.

Thus, each recirculation air handling unit 70 is operable, via the respective fan 86, to generate a forced air flow through the respective recirculation air handling unit 70 by drawing air in from the upper plenum 34 through the respective air inlet stack, or duct, 90 and inlet 74, passing the air through the filter(s) 82, and forcing the air out into the lower plenum 38 through the respective air outlet 78. More particularly, by drawing air from the upper plenum 34 and forcing the air into the lower plenum 38, operation of any one or more recirculation air handling units 70 will create a recirculation air flow through and or within the habitability area 14. That is, operation of any one or more recirculation air handling units 70 will draw air from the upper plenum 34 and force air into the lower plenum 38, which will circulate and recirculate air from the lower plenum 38, through the occupant space 58 and into the upper plenum 34, via the vents and registers 62 and 66. Thus, operation of any one or more recirculation air handling units 70 will generate a recirculation air flow within the habitability area 14 absent openings in the habitability area outer boundary for the ingress or egress of air carrying ductwork of the recirculation and conditioning subsystem 26 through which unsafe or hazardous air can infiltrate the habitability area 14 during a radiological and/or toxic event.

As described above, as air is forced though each respective recirculation air handling units 70, the air is passed through the one or more filters 82. In various embodiments, the filter(s) 82 may be any filter or filter train suitable to remove various non-radioactive, non-toxic environmental particulates such as dust, dirt, pollen, etc. from the recirculation air flow within the habitability area 14. Additionally, in various embodiments, each recirculation air handling units 70 may include a heating element 98, e.g., an electric heating coil. Each heating element 98 is operable to heat the recirculation air flow within the habitability area 14 to a desired temperature, by heating the forced air flow through the respective each recirculation air handling units 70.

Furthermore, in various embodiments, the recirculation and conditioning subsystem 26 may include a chilled coolant thermal storage tank 102 that is fluidly connected to a cooling coil 106 of each respective recirculation air handling units 70. In various embodiments, the chilled coolant thermal storage tank 102 is remotely located from the habitability area 14. For example, in various implementations, the chilled coolant thermal storage tank 102 is located in a utility equipment room 116A that is separated from the habitability area 14. Generally, the chilled coolant thermal storage tank 102 is structured and operable to retain and cool a quantity of coolant, e.g., water or other suitable coolant, that is pumped through the recirculation air handling unit cooling coils 106 to cool the recirculation air flow within the habitability area 14 to a desired temperature, by cooling the forced air flow through the respective each recirculation air handling units 70. More particularly, the cooling coil 106 of each recirculation air handling units 70 is fluidly connected to the chilled coolant thermal storage tank 102 via chilled coolant piping 110 and return coolant piping 114.

Coolant pumps 118 are connected in-line with the chilled coolant piping 110 to pump chilled coolant from the chilled coolant thermal storage tank 102 to the respective cooling coils 106 of the recirculation air handling unit(s) 70. The chilled coolant then circulates through the cooling coil(s) 106 and is returned to the chilled coolant thermal storage tank 102 via the return coolant piping 114. As the forced air flow circulates through the one or more recirculation air handling units 70, as described above, the respective cooling coil(s) 106 and chilled coolant flowing there through remove heat from the air being forced into the lower plenum 38. Thus, the recirculation air flow through and within the habitability area 14 is cooled to a desired temperature.

Turning now to the replacement air subsystem 30 of the NOAFC subsystem 18, generally the replacement air subsystem 30 provides filtered replacement air to the habitability area 14. Operation of the recirculation and conditioning subsystem 26, as described above, creates a positive pressure within the habitability area 14. The positive pressure will force air from within the habitability area 14 out of the habitability area 14 when openings are created within the habitability area outer boundary. For example, an opened door, uncovered electrical outlets, etc., will present openings within the outer boundary through which air from outside the habitability area 14 can infiltrate. Thus, the positive pressure prevents air outside the habitability area 14 from infiltrating, or entering, the habitability area 14 through such openings. To maintain the positive pressure within the habitability area 14 the replacement air subsystem 30 force air into the upper plenum 34 and/or the lower plenum of the habitability area 14. Although FIG. 2 illustrates the replacement air flow being forced into the upper plenum 34, it should be understood that the replacement air flow could similarly be forced into lower plenum 38 and remain within the scope of the present disclosure.

In various embodiments, the replacement air subsystem 30 is remotely located from the habitability area 14. For example, in various implementations, the replacement air subsystem 30 is located in a utility equipment room 116B that is separated from the habitability area 14. It should be understood that although utility equipment rooms 116A and 116B are illustrated as separate equipment rooms, in various embodiments the utility equipment rooms 116A and 116B can be a single utility equipment room 116 in which the chilled coolant thermal storage tank 102, the replacement air subsystem 30, and various other equipment, systems and subsystems described herein can be located.

The replacement air subsystem 30 includes one or more replacement air handling units 122 that generate a replacement air flow into the upper and/or lower plenums 34 and/or

38. Particularly, each replacement air handling unit 122 includes an air inlet 126, an air outlet 130, at least one filter 134 and a fan, or blower, 138. The replacement air handling unit filter(s) 134 can be any filter(s) suitable for removing various non-radioactive, non-toxic environmental particulates, such as dust, dirt, pollen, etc., from the replacement air flow that is forced into the upper and/or lower plenums 34 and/or 38 of the habitability area 14.

The fan 138 is operable to draw air into the respective replacement air handling unit 122, via the inlet 126, pass the air through the filter(s) 134 and force the filtered air out through the outlet 130. More specifically, each replacement air handling unit 122 draws air in from an environment outside of the habitability area 14 and forces the air into the upper and/or lower plenums 34 and/or 38 via replacement air carrying conduit, e.g., ductwork, 142. The replacement air ductwork 142 is connected to the outlet 130 of each replacement air handling unit 122, extends through the habitability area outer boundary, and terminates within the upper and/or lower plenums 34 and/or 38. Accordingly, each replacement air handling unit fan 126 is operable to draw air into the replacement air handling unit 122 from an environment outside of the habitability area 14, pass the air through the respective filter(s) 134, and force the filtered air into the habitability area upper plenum 34 and/or the lower plenum 38, via the replacement air ductwork 142. As described above, forcing air into at least one of the upper and lower plenums 34 and 38 creates and maintains a positive pressure within the habitability area 14 that will prevent the air outside the habitability area 14 from infiltrating, or entering, the habitability area 14 through various openings in the habitability area outer boundary.

In various embodiments, the replacement air subsystem 30 further includes a pair of isolation dampers 146 within the replacement air carrying ductwork 142. The isolation dampers 146 are structured and operable to provide a substantially air-tight seal within the replacement air carrying ductwork 142 such that air can not flow into or out of the habitability area upper and/or lower plenums 34 and 38, via the replacement air carrying ductwork 142, during a radiological and/or toxic event. More particularly, in various embodiments, the isolation dampers 146 are located within replacement air ductwork 142 substantially immediately adjacent the exterior boundary of the habitability area 14 such that there is very little, if any, replacement air ductwork 142 extending between the isolation dampers 146 and the exterior of the habitability area outer boundary. This limits the amount of air, e.g., contaminated or hazardous air, exiting within the replacement air ductwork 142 between the isolation dampers 146 and the exterior of the habitability area outer boundary, that can flow into the habitability area 14 after the isolation dampers 146 have been closed.

As illustrated in FIG. 2, in various embodiments, the replacement air subsystem 30 may include a pair of replacement air handling units 122. The redundant replacement air handling units 122 are implemented such that if one replacement air handling unit 122 fails or becomes inoperable, the second replacement air handling unit 122 will be operable to generate the replacement air flow into the habitability area upper plenum 34, as described below.

Additionally, in various embodiments, the recirculation and conditioning subsystem 26 may include one or more stored energy power sources 150. The stored energy power source(s) 150 can be any suitable passive source of stored electrical power such as a bank of direct current (DC) batteries. The stored energy power source(s) 150 are structured and operable to provide electrical power to the recirculation air handling unit(s) 70 and/or the chilled coolant thermal storage tank pumps 118 in the absence of a constant power source such as any offsite or onsite generator or electrical power utility company. For example, if a radiological and/or toxic event should occur, the constant power supply to the recirculation air handling unit(s) 70, a replenishment supply of coolant to the chilled coolant thermal storage tank 102, and the chilled coolant thermal storage tank pumps 118 may be disabled or terminated. In such instances, the stored energy power source(s) 150 would automatically be enabled to provide power to operate the recirculation air handling unit(s) 70 and/or the chilled coolant thermal storage tank pumps 118 for a limited duration of time, e.g., 1 hour, 2 hours, 3 hours, 4 hours, 1 day, 2 days, 3 days, 4 days, etc.

In various embodiments, the recirculation and conditioning subsystem 26 may include a plurality of stored energy power sources 150 such that each recirculation air handling unit 70 and/or the chilled coolant thermal storage tank pumps 118 are electrically connected to a respective one of the stored energy power sources 150. Thus, each of the recirculation air handling unit 70 and/or the chilled coolant thermal storage tank pumps 118 would be powered by a separate, independent stored energy power source 150 in the absence of a constant power source. Alternatively, in various embodiments, the recirculation and conditioning subsystem 26 may include a single stored energy power source 150 configured to provide electrical power to each of the recirculation air handling unit(s) 70 and/or the chilled coolant thermal storage tank pumps 118 in the absence of a constant power source. Or, still further, in other embodiments, the recirculation and conditioning subsystem 26 may include a first stored energy power source 150 configured to provide electrical power to each of the recirculation air handling unit(s) 70 and a second stored energy power source 150 configured to provide electrical power to the chilled coolant thermal storage tank pumps 118 in the absence of a constant power source.

Referring again to FIG. 1, in various embodiments, the recirculation and conditioning subsystem 26 may include a smoke purge subsystem 154. The smoke purge subsystem 154 includes a smoke purge fan 158 that is located exterior to the habitability area 14 and fluidly connected to the upper plenum 34 via smoke purge outlet conduit, or ductwork, 162 extending through the habitability area outer boundary. The smoke purge subsystem 154 additionally includes smoke purge inlet conduit, or ductwork, 166 that fluidly connects an exterior air access 170 to the lower plenum 38 via smoke purge inlet ductwork 166. The smoke purge subsystem 154 is structured and operable to quickly purge and replace the air from within the habitability area 14. For example, should the habitability area become filled with smoke due to an accident or fire at the nuclear reactor facility or within the habitability area 14, the smoke purge subsystem 154 can be activated to quickly purge the smoke to the environments outside of the habitability area 14, via the fan 158 and outlet ductwork 162. Substantially simultaneously, replacement air from outside of the habitability area 14 will be drawn into the habitability area 14, via the fan 158 and inlet ductwork 166.

Additionally, in various implementations, the smoke purge subsystem 154 further includes a pair of inlet isolation dampers 174 within the smoke purge inlet ductwork 166. The inlet isolation dampers 174 are structured and operable to provide a substantially air-tight seal within the smoke purge inlet ductwork 166 such that air can not flow into or out of the habitability area 14 via the smoke purge inlet ductwork 166, during a radiological and/or toxic event. More particularly, the inlet isolation dampers 174 are located within the smoke purge inlet ductwork 166 substantially immediately adjacent the exterior boundary of the habitability area 14 such that there is very little, if any, inlet ductwork 166 extending between the inlet isolation dampers 174 and the exterior of the habitability area outer boundary. This limits the amount of air, e.g., contaminated or hazardous air, exiting within the inlet ductwork 166 between the inlet isolation dampers 174 and the exterior of the habitability area outer boundary, that can flow into or out of the habitability area 14 after the inlet isolation dampers 174 have been closed.

Furthermore, in various implementations, the smoke purge subsystem 154 includes a pair of outlet isolation dampers 178 within the smoke purge outlet ductwork 162. The outlet isolation dampers 178 are structured and operable to provide a substantially air-tight seal within the smoke purge outlet ductwork 162 such that air can not flow into or out of the habitability area 14 via the smoke purge outlet ductwork 162, during a radiological and/or toxic event. More particularly, the outlet isolation dampers 178 are located within the smoke purge outlet ductwork 162 substantially immediately adjacent the exterior boundary of the habitability area 14 such that there is very little, if any, outlet ductwork 162 extending between the outlet isolation dampers 178 and the exterior of the habitability area outer boundary. This limits the amount of air, e.g., contaminated or hazardous air, exiting within the outlet ductwork 162 between the outlet isolation dampers 178 and the exterior of the habitability area outer boundary, that can flow into or out of the habitability area 14 after the outlet isolation dampers 178 have been closed.

Figure 3:
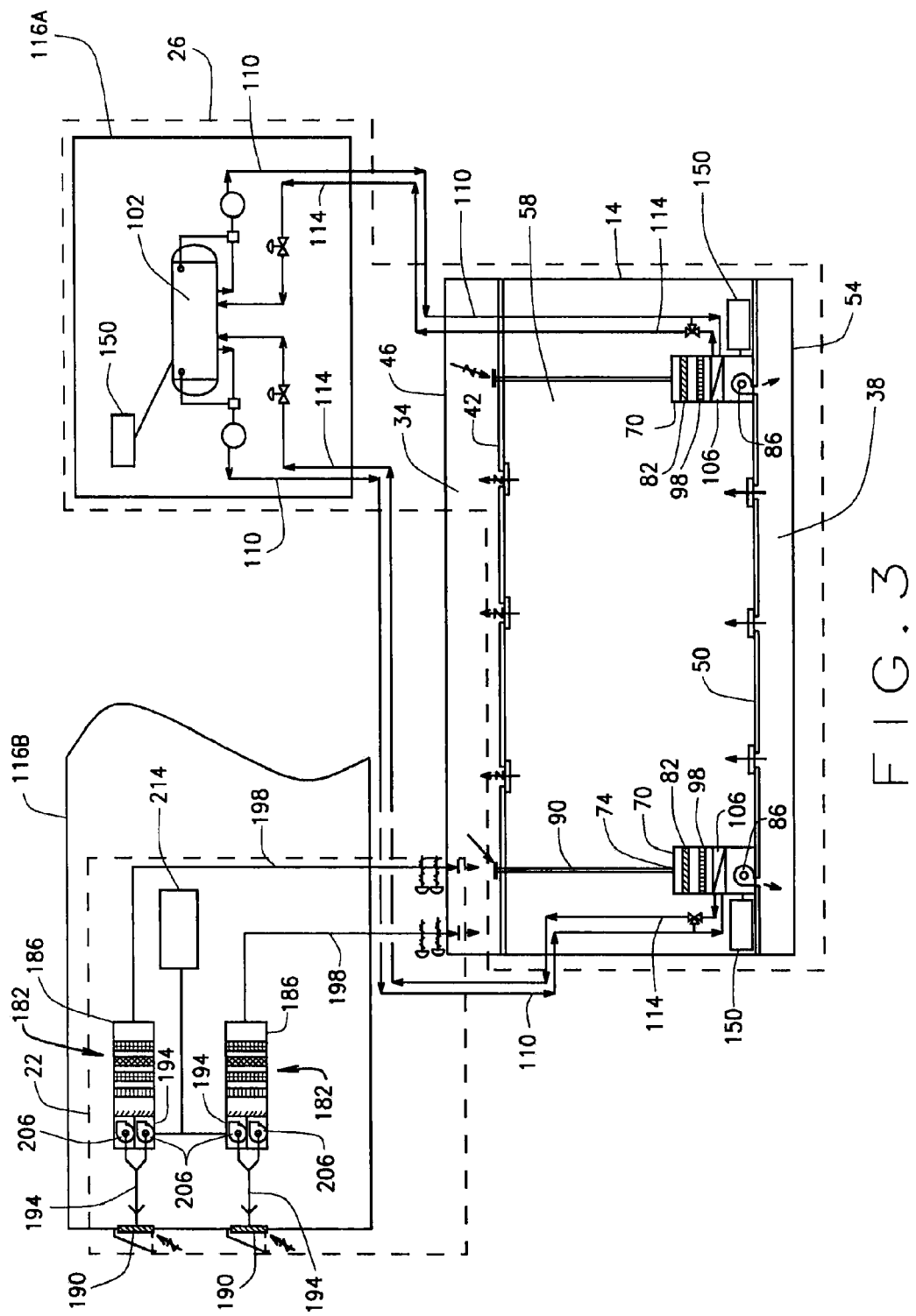
FIG. 3 is a block schematic illustrating an emergency filtration subsystem of the AFC system shown in FIG. 1, in accordance with various embodiments of the present disclosure.

Referring now to FIG. 3, as described above, the emergency filtration (EF) subsystem 22 is structured and operable to provide air to the habitability area 14 that is substantially free from radioactive and/or toxic contaminates during a radiological and/or toxic event. The EF subsystem 22 includes one or more emergency air filtration units (EAFUs) 182. In various embodiments, as illustrated in FIG. 3, the EF subsystem 22 may include two or more redundant EAFUs 182. The redundant EAFUs 182 are implemented such that if one EAFU 182 fails or becomes inoperable, a second EAFU 182 will be operable, and so on, to provide air to the habitability area 14 that is substantially free from radioactive and/or toxic contaminates during a radiological and/or toxic event. Although the EF subsystem 22 may include a single EAFU 182 and remain within the scope of the present disclosure, for clarity and simplicity, the EF subsystem 22 will be described herein as including two or more redundant EAFUs 182.

In various implementations, the EAFUs 182 are located remotely from the habitability area 14. For example, the EAFUs 182 can be located in a utility equipment room 116, e.g., equipment room 116A, that is separated from the habitability area 14. Each EAFU 182 is structured and operable to provide air free from radioactive and toxic contaminates to the habitability area.

Figure 4:
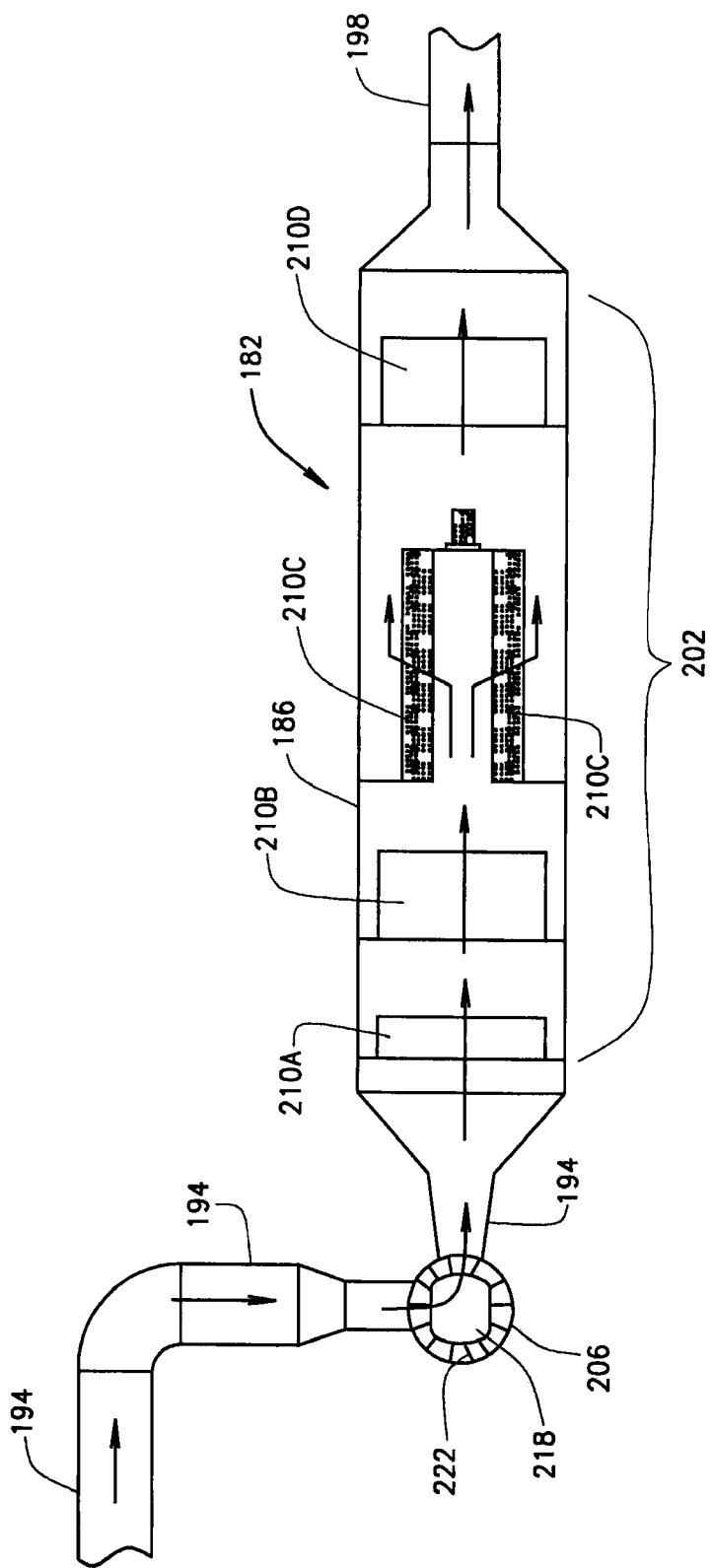
FIG. 4 is cross-sectional block diagram of an emergency air filtration unit included emergency filtration subsystem shown in FIG. 3, in accordance with various embodiments of the present disclosure.

Referring also to FIG. 4, each EAFU 182 includes a housing 186 connected to an outside air source 190 via inlet air conduit, or ductwork, 194 and to the habitability area 14 via outlet air conduit, or ductwork, 198. Each EAFU 182 additionally includes a filter train 202 (best illustrated in FIG. 4) within the housing 186, and at least one fan assembly 206. Each fan assembly 206 is structured and operable to generate an air flow from the outside air source 190 into the habitability area 14 by drawing air in through the inlet ductwork 194, forcing the air through the filter train 202 to filter out radioactive and/or toxic contaminates, and forcing the filtered air out through the outlet ductwork 198 into the habitability area upper and/or lower plenum 34 and/or 38.

In various embodiments, as illustrated in FIG. 3, each EAFU 182 may include two redundant fan assemblies 206. The redundant fan assemblies 206 are implemented such that if one fan assembly 206 fails or becomes inoperable, the second fan assembly 206 will be operable to provide the filtered air to the habitability area 14 that is substantially free from radioactive and/or toxic contaminates. Although each EAFU 182 may include a single fan assembly 206 and remain within the scope of the present disclosure, for clarity and simplicity, the EAFUs 182 will be described herein as including redundant fan assemblies 206.

The filter train 202 of each EAFU 182 includes a plurality of air filters 210 suitable for removing radioactive and toxic contaminates from air flow generated through the respective EAFU 182, via the respective fan assemblies 206. For example, in various embodiments, each filter train 202 may include a first particulate filter 210A, a second particulate filter 210B, a carbon bed filter 210C and a third particulate filter 210D. The first particulate filter 210A can be any filter suitable for removing larger radioactive and/or toxic particles from the air flow as the air flow enters the respective EAFU 182, via inlet ductwork 194. The air flow can then pass though the second particular filter 210B, e.g., a HEPA filter, to remove most of the remaining radioactive and/or toxic particles. The carbon bed filter 210C can be any filter suitable for aromatically filtering the air flow, i.e., removing undesirable odors and/or radioactive gasses from the air flow, and the third particulate filter 210D can be any filter suitable for removing any remaining radioactive and/or toxic particles and any carbon dust that may be in the airflow after passing through the carbon bed filter 210C. Thus, the air flow exiting each EAFU 182 and forced into the habitability area upper and/or lower plenum 34 and/or 38, via the outlet ductwork 198 will be free of hazardous radioactive and/or toxic gasses particles.

In various embodiments, the EF subsystem 22 includes one or more stored energy power sources 214. The stored energy power source(s) 214 can be any suitable passive source of stored electrical power such as a bank of direct current (DC) batteries. The stored energy power source(s) 214 are structured and operable to provide electrical power to the EAFUs 182 in the absence of a constant power source such as any offsite or onsite generator or electrical power utility company. For example, if a radiological and/or toxic event should occur, the constant power supply to the EAFU(s) 182 may be disabled or terminated. In such instances, the stored energy power source(s) 214 would automatically be enabled to provide power to operate the EAFU(s) 182, as described herein, for a limited duration of time, e.g., 1 hour, 2 hours, 3 hours, 4 hours, 1 day, 2 days, 3 days, 4 days, 1 week, 2 weeks etc.

As illustrated in FIG. 3, in various embodiments, the recirculation and conditioning subsystem 26 can operate, as described above, in combination with the EF subsystem 22 during a radiological and/or toxic event. For example, during a radiological and/or toxic event, the recirculation air handling unit(s) 70 and the chilled coolant thermal storage tank 102, i.e., the pumps 118, can operate, utilizing the store energy power source(s) 150 as described above, to circulate, filter and cool the radioactive and toxic free air within the habitability area 14 that is being provided by the EF subsystem 22. However, it should be understood that operation of the EF subsystem 22 alone is sufficient to circulate the radioactive and toxic free air within the habitability area 14 such that occupants of the habitability area 14 are provided sufficient safe, breathable air to comfortably survive.

Referring particularly to FIG. 4, each fan assembly 206 includes a motor 218 operable to drive an air mover 222, e.g., a fan, to generate the air flow through the respective EAFU 182. In various embodiments, each fan assembly 206 is located in-line with, or internal to, the inlet ductwork 194 such that the air drawn into the inlet ductwork 194 will flow across and/or around the respective motor 218. As the air flows across and/or around the respective motor 218 the air will extract heat generated by the respective motor 218, thereby increasing the temperature of the airflow through the respective EAFU 182. Accordingly, the heat generated by the operation of each motor 218 can be utilized to heat the air being forced into the habitability area upper and/or lower plenum 34 and/or 38, and thus, heat the air circulating within the habitability area 14 during operation of the EF subsystem 22. Additionally, the heat generated by the operation of each motor 218 can be utilized to dry the air, i.e., remove moisture from the air, being forced into the habitability area upper and/or lower plenum 34 and/or 38, and thus, dry the air circulating within the habitability area 14 during operation of the EF subsystem 22.

Referring again to FIGS. 3 and 4, in various embodiments, the inlet ductwork 194, the filter train 202 and the outlet ductwork 198 of the EF subsystem 22 have cross-sectional areas, or diameters, that are sized to provide a very small pressure loss between the air flowing through the inlet ductwork 194 and the air flowing through the outlet ductwork 198. For example, in various implementations, the inlet ductwork 194, the filter train 202 and the outlet ductwork 198 have cross-sectional areas, or diameters, that are oversized to be large enough that a pressure differential is produced between the air flowing through the inlet ductwork 194 and the air flowing through the outlet ductwork 198 of approximately 1 w.g. (water gage) to 5 w.g. Particularly, the oversized filter train 202 and inlet and outlet ductwork 194 and 198 lower the differential pressure across the filters 210. That is, the oversized filter train 202 and inlet and outlet ductwork 194 and 198 reduce the required air pressure needed to pass the air through the filters 210 and reduce internal ductwork losses.

Additionally, the large sized cross-sectional area, or diameters, of the inlet ductwork 194, the filter train 202 and the outlet ductwork 198 allow the EF subsystem 22, i.e., the EAFUs 182, to provide a substantial positive pressure air flow through the habitability area 14. For example, in various implementations, the large sized cross-sectional area, or diameters, of the inlet ductwork 194, the filter train 202 and the outlet ductwork 198 can allow each EAFU 182 to provide a positive pressure air flow through the habitability area 14 of approximately 300 cfm (cubic feet per minute) to 500 cfm.

Moreover, such positive pressure air flows through the habitability area 14, resulting from the oversized filter train 202 and inlet and outlet ductwork 194 and 198, provide an increased purging and dilution of unfiltered air that may infiltrate the habitability area 14. An increased purging and dilution of unfiltered air infiltrating the habitability area 14 reduces the risk hazardous contaminates in unfiltered infiltrating air will pose for occupants of the habitability area 14. For example, in various embodiments, the oversized filter train 202 and inlet and outlet ductwork 194 and 198 provide a positive pressure air flow through the habitability area 14 sufficient to safely purge and dilute in-leakage of unfiltered air into the habitability area of approximately 1 cfm to 13 cfm.

Still further, the reduction in internal air pressure of the air flowing through each respective EAFU 182 and the internal losses of the air flowing through the inlet and outlet ductwork 194 and 198 due to the oversized filter train 202 and inlet and outlet ductwork 194 and 198 result in a reduced power requirement of the each respective motor 218. That is, oversizing the filter train 202 and inlet and outlet ductwork 194 and 198, thereby reducing the pressure drop across the filter train 202, translates directly into a lowering of the horsepower requirement of each fan assembly motor 218. For example, in various embodiments, each respective fan assembly motor 218 can be rated at approximately 0.5 hp to 2.0 hp, e.g., 1.5 hp, while producing the pressure differential and positive pressure air flow through the habitability area 14 described above.

Furthermore, in various embodiments, the air source 190 is located at a fixed location, with respect to a nuclear reactor of the nuclear reactor facility, such that the air drawn into the EAFUs 182 is determined to most likely have the lowest concentration of radioactive and/or toxic contaminates during a radiological and/or toxic event. For example, mathematical modeling can be utilized to determine an optimum location at the nuclear reactor facility which will most likely have the lowest concentration of radioactive and/or toxic contaminates during a radiological and/or toxic event. Accordingly, in various embodiments, the air source 190 will be located at the predetermined optimum location such that the EF subsystem 22 will operate, as described above, to filter air predetermine to most likely have the lower concentrations of radioactive and/or toxic contaminates during a radiological and/or toxic event.

It should be understood that, although the terms first, second, third, etc., may be used herein to describe various elements, components, regions and/or sections, these elements, components, regions and/or sections should not be limited by these terms. These terms may be only used to distinguish one element, component, region or section from another component, region or section.

Additionally, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Furthermore, the terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, components, etc., but do not preclude the presence or addition of one or more other features, integers, steps, operations, elements, components, groups, etc., thereof.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A system for circulating and conditioning air within a nuclear plant, said system comprising:
 a habitability area with walls, a ceiling and a floor;
 an upper plenum formed between a lowered ceiling partition within the habitability area and the ceiling of the habitability area;
 a lower plenum formed between a raised floor partition within the habitability area and the floor of the habitability area;
 at least one recirculation air handling unit located within the habitability area, the at least one recirculation air handling unit operable to generate a recirculation air flow throughout the habitability area by circulating air between the lower and upper plenums absent any air carrying ductwork routed through the ceiling, floor or walls of the habitability area; and
 a smoke purge subsystem including,
  a smoke purge fan located exterior to the habitability area and directly connected to the upper plenum via smoke purge outlet ductwork, and
  exterior air inlet ductwork connecting an exterior air access to the lower plenum via the exterior air inlet ductwork,
  the smoke purge fan being a dedicated fan for the upper plenum of the habitability area and being operable to draw exterior air into the habitability area through the exterior air inlet ductwork and purge air from within the habitability area to an environment exterior of the habitability area through the smoke purge outlet ductwork,
  the lower plenum being a supply plenum for the recirculation air flow and the upper plenum being a return plenum for the recirculation air flow,
  wherein the smoke purge fan is further operable to draw the exterior air into the habitability area through the exterior air inlet ductwork and purge air from within the habitability area to the environment exterior of the habitability area through the smoke purge outlet ductwork even during periods when the at least one recirculation air handling unit is not in operation.

2. The system of claim 1, further comprising at least one recirculation air handling unit stored energy power source structured and operable to provide operating power to the at least one recirculation air handling unit for a limited duration in the absence of constant supplied power.

3. The system of claim 1, wherein the at least one recirculation air handling unit comprises a heating element for heating the recirculation air flow generated by the at least one recirculation air handling unit.

4. The system of claim 1, further comprising a chilled coolant thermal storage tank located in a room separate from the habitability area and fluidly connected to the at least one recirculation air handling unit to provide chilled coolant to the at least one recirculation air handling unit for cooling the recirculation air flow generated by the at least one recirculation air handling unit.

5. The system of claim 1, further comprising at least one chilled coolant thermal storage tank stored energy power source structured and operable to provide operating power to the chilled coolant thermal storage tank for a limited duration in the absence of constant supplied power.

6. The system of claim 1, further comprising a replacement air subsystem, the replacement air subsystem including;
 at least one replacement air handling unit located within a room separate from the habitability area, and
 replacement air carrying ductwork connecting the at least one replacement air handling unit to one of the upper plenum and the lower plenum for providing replacement air to the habitability area.

7. The system of claim 6, wherein the replacement air subsystem further includes a pair of isolation dampers within the replacement air carrying ductwork substantially immediately adjacent an exterior boundary of the habitability area, the isolation dampers structured and operable to provide a substantially air-tight seal within the replacement air carrying ductwork such that air can not flow into or out of the habitability area via the replacement air carrying ductwork.

8. The system of claim 1, wherein the smoke purge subsystem further includes:
 a pair of inlet isolation dampers positioned in series within the exterior air inlet ductwork substantially immediately adjacent an exterior boundary of the habitability area, the inlet isolation dampers structured and operable to provide a substantially air-tight seal within the exterior air inlet ductwork when the smoke purge subsystem is not operating such that air cannot flow into or out of the habitability area via the exterior air inlet ductwork; and
 a pair of outlet isolation dampers positioned in series within the smoke purge outlet ductwork substantially immediately adjacent the exterior boundary of the habitability area, the outlet isolation dampers structured and operable to provide a substantially air-tight seal within the smoke purge outlet ductwork when the smoke purge subsystem is not operating such that air cannot flow into or out of the habitability area via the smoke purge outlet ductwork.

9. A system for circulating and conditioning air within a nuclear plant, said system comprising:
 a habitability area with walls, a ceiling and a floor;
 an upper plenum formed between a ceiling partition within the habitability area and the ceiling of the habitability area, the ceiling partition including a plurality of air vents;
 a lower plenum formed between a raised floor partition within the habitability area and the floor of the habitability area, the floor partition including a plurality of air registers;
 a pair of redundant recirculation air handling units located within the habitability area, each recirculation air handling unit including an air inlet fluidly connected to the upper plenum, an air outlet fluidly connected to the lower plenum and a fan operable to generate a forced air flow through the respective recirculation air handling unit by drawing air in from the upper plenum through the respective air inlet and forcing air out into the lower plenum through the respective air outlet such that a recirculation air flow is created throughout the habitability area by air flowing out of the lower plenum through the floor partition registers and into the upper plenum through ceiling partition vents; and
 a smoke purge subsystem including, a smoke purge fan located exterior to the habitability area and directly connected to the upper plenum via smoke purge outlet ductwork, and exterior air inlet ductwork connecting an exterior air access to the lower plenum via the exterior air inlet ductwork, the smoke purge fan being a dedicated fan for the upper plenum of the habitability area and being operable to draw exterior air into the habitability area through the exterior air inlet ductwork and purge air from within the habitability area to an environment exterior of the habitability area through the smoke purge outlet ductwork, the lower plenum being a supply plenum for the recirculation air flow and the upper plenum being a return plenum for the recirculation air flow, wherein the smoke purge fan is further operable to draw the exterior air into the habitability area through the exterior air inlet ductwork and purge air from within the habitability area to the environment exterior of the habitability area through the smoke purge outlet ductwork even during periods when the pair of redundant recirculation air handling units is not in operation.

10. The system of claim 9, further comprising at least one recirculation air handling unit stored energy power source structured and operable to provide operating power to each recirculation air handling unit for a limited duration in the absence of constant supplied power.

11. The system of claim 9, wherein each recirculation air handling unit comprises a heating element for heating the recirculation air flow generated by the at least one recirculation air handling unit.

12. The system of claim 9, further comprising a chilled coolant thermal storage tank located in a room separate from the habitability area and fluidly connected to each of the recirculation air handling units to provide chilled coolant to the recirculation air handling units for cooling the recirculation air flow generated by the respective recirculation air handling unit.

13. The system of claim 9, further comprising at least one chilled coolant thermal storage tank stored energy power source structured and operable to provide operating power to the chilled coolant thermal storage tank for a limited duration in the absence of constant supplied power.

14. The system of claim 9, further comprising a replacement air subsystem, the replacement air subsystem including;

a pair of redundant replacement air handling units located within a room separate from the habitability area, and replacement air carrying ductwork connecting each replacement air handling unit to one of the upper plenum and the lower plenum for providing replacement air to the habitability area.

15. The system of claim 14, wherein the replacement air subsystem further includes a pair of isolation dampers within the replacement air carrying ductwork substantially immediately adjacent an exterior boundary of the habitability area, the isolation dampers structured and operable to provide a substantially air-tight seal within the replacement air carrying ductwork such that air can not flow into or out of the habitability area via the replacement air carrying ductwork.

* * * * *